(12) United States Patent
Bernstein et al.

(10) Patent No.: US 7,244,367 B2
(45) Date of Patent: Jul. 17, 2007

(54) METAL ALLOY ELEMENTS IN MICROMACHINED DEVICES

(75) Inventors: Jonathan J. Bernstein, Medfield, MA (US); William P. Taylor, North Andover, MA (US)

(73) Assignee: JDS Uniphase Corporation, Milpitas, CA (US)

( * ) Notice: Subject to any disclaimer, the term of this patent is extended or adjusted under 35 U.S.C. 154(b) by 211 days.

(21) Appl. No.: 10/015,086

(22) Filed: Dec. 11, 2001

(65) Prior Publication Data

US 2003/0116528 A1 Jun. 26, 2003

(51) Int. Cl.
*H01L 21/00* (2006.01)
*B44C 1/22* (2006.01)
*C23F 1/00* (2006.01)

(52) U.S. Cl. .......................... 216/2; 216/100; 425/594; 425/620; 435/754

(58) Field of Classification Search ................ 438/720, 438/754; 216/2, 100; 428/594, 620
See application file for complete search history.

(56) References Cited

U.S. PATENT DOCUMENTS

| | | | |
|---|---|---|---|
| 5,867,202 A | | 2/1999 | Knipe et al. |
| 6,069,540 A | | 5/2000 | Berenz et al. |
| 6,102,531 A | * | 8/2000 | Gentsu .................. 347/72 |
| 6,114,794 A | | 9/2000 | Dhuler et al. |
| 6,236,139 B1 | * | 5/2001 | Hill et al. .............. 310/307 |
| 6,239,685 B1 | | 5/2001 | Albrecht et al. |
| 6,245,444 B1 | | 6/2001 | Marcus et al. |
| 6,253,011 B1 | | 6/2001 | Haake |
| 6,254,793 B1 | | 7/2001 | Silverbrook |
| 6,256,134 B1 | | 7/2001 | Dhuler et al. |
| 6,261,494 B1 | | 7/2001 | Zavracky et al. |
| 6,307,452 B1 | * | 10/2001 | Sun ....................... 333/262 |
| 6,476,333 B1 | * | 11/2002 | Khandros et al. ...... 174/267 |
| 6,541,676 B1 | * | 4/2003 | Franz et al. ............ 585/250 |
| 6,624,003 B1 | * | 9/2003 | Rice ...................... 438/106 |
| 6,663,035 B2 | * | 12/2003 | Shiga et al. ............ 242/348.2 |
| 2001/0008157 A1 | * | 7/2001 | Bishop et al. .......... 148/678 |
| 2001/0049193 A1 | * | 12/2001 | Golecki et al. ......... 438/674 |
| 2003/0099097 A1 | * | 5/2003 | Mok et al. .............. 361/767 |
| 2003/0216700 A1 | * | 11/2003 | Pearson et al. ......... 604/266 |

FOREIGN PATENT DOCUMENTS

| | | | |
|---|---|---|---|
| DE | 1980996 A1 | * | 9/1999 |
| EP | 1 096 523 A3 | | 5/2001 |
| EP | 1 096 523 A2 | | 5/2001 |
| FR | 2458151 A | * | 1/1981 |
| JP | 57-057421 A | * | 4/1992 |
| JP | 05174932 A | * | 7/1993 |
| JP | 11-284244 | * | 10/1999 |
| JP | 2001-337110 | * | 12/2001 |
| WO | WO 00/46852 | | 8/2000 |
| WO | WO 01/56066 A1 | | 8/2001 |

OTHER PUBLICATIONS

R. P. Vinci "Solid Solution Strengthening in Pt–Ru Thin Films," Materials Research Society, Symposium Proceedings Series, vol. 695, Abstract L1.1, Nov. 26–30, 2001.

M. Becker et al., "Application of Electroplating in MEMs–micromachining Exemplified by a Microrelay," Microsystem Technologies, 196–202, 2001.

* cited by examiner

*Primary Examiner*—Anita Alanko
(74) *Attorney, Agent, or Firm*—Allen, Dyer, Doppelt, Milbrath & Gilchrist, P.A.

(57) ABSTRACT

A micromechanical device is provided, which includes at least one flexible member formed from an alloy, where the alloy is made up of one or more noble metals and one or more alloying elements, wherein each of the alloying elements has an equilibrium solid solubility in the noble metal, and wherein the one or more alloying elements are present in an amount that does not result in precipitates. A method for making a micromechanical device includes depositing an alloy on a substrate to form at least one flexible member, the alloy comprising one or more noble metals and one or more alloying elements, wherein the one or more alloying elements form a solid solution with the one or more noble metals; and removing a portion of the substrate or a sacrificial layer beneath the deposited alloy layer to obtain a flexible member.

46 Claims, 4 Drawing Sheets

PT ALLOY FLEXURES SUPPORTING MIRROR

METAL ALLOY ELEMENTS IN MICROMACHINED DEVICES

BACKGROUND OF THE INVENTION

The present invention relates to microelectromechanical devices and, more particularly, to micromachined devices containing moving parts supported by flexible members or springs.

Microelectromechanical systems (MEMS) are being developed as alternatives to conventional electromechanical devices such as relays, actuators, valves and sensors. MEMS devices are potentially low cost devices, due to the use of microfabrication techniques. New functionality may also be provided because MEMS devices can be much smaller than conventional electromechanical devices.

Many potential applications for MEMS devices involve moving parts. For example, sensors, switches, valves and positioners use MEMS devices as actuators for movement. If properly designed, MEMS actuators can produce useful forces and displacement while consuming reasonable amounts of energy. The moving parts of these devices are supported on flexible members, such as flexures or springs. The properties of these springs often are critical to the performance of the overall system.

The movable or flexible elements of a MEMS device typically are required to move repetitively from a first, typically resting, position to a second position under application of a force. The flexible element should be able to return to its initial position once that force is removed (material memory or low hysteresis), or upon application of an opposing force. Thus, it is desirable that the flexible member exhibit high fracture toughness, high yield strength and low plasticity so that it can undergo many cycles without material failure. In addition, many applications require that the MEMS flexible element be a conductive member, as well as a mechanical or structural member. Lastly, it is desirable that the material exhibit good corrosion resistance, in particular to the etchants used in the processing of the device, and low toxicity.

MEMS or micromechanical devices have been built using silicon, polysilicon, metals and organic polymers. However, none of the currently available materials satisfy all of the performance requirements for a MEMS device. Many of these materials exhibit properties such as brittleness, fatigue, creep or plastic deformation that are undesirable or unacceptable to device performance.

Silicon has been used in MEMS devices as a flexible element, however, its brittleness and relatively poor conductivity make it impractical in many applications. Even highly doped silicon is not suitable for applications where currents of several milliamperes must be passed through the flexible element with low voltage drop. Furthermore, silicon is typically deposited at high temperatures, making it incompatible with many other microfabrication steps.

Pure metals such as gold, nickel and copper, have been used, however, they exhibit poor yield strength and plastic deformation. Precipitate hardened metals have been investigated, however the dispersion of microprecipitates limits fatigue strength, and requires heat treatment and mechanical working to achieve the desired microstructure.

Beryllium-doped copper (Be—Cu) is a good spring material, however, it is highly toxic and subject to corrosion. The corrosion films normally observed on copper surfaces may actually be thicker than the desired MEMS spring or flexible member. In addition, many of the chemical etches used in the semiconductor process unacceptably etch the copper alloy.

Thus, there is a need for flexible members that overcome the performance limitations of flexible members currently used in MEMS devices.

There is a further need in many applications that the MEMS device, and the flexible member of the MEMS device, be electrically conductive.

There is a further need in some applications for flexible MEMS elements that are non-ferromagnetic.

There is a further need for materials used for the flexible member of the MEMS device that are compatible with other microfabrication processes used in the preparation and processing of the MEMS device.

SUMMARY OF THE INVENTION

These and other limitations of the prior art are addressed by MEMS devices of the present invention that include flexible elements made from noble metal alloys.

The noble metal alloy MEMS device of the present invention exhibit high yield strength, low plasticity, are electrically conductive and provide superior mechanical, material and/or electrical properties, as compared to current MEMS devices.

In one aspect of the invention, a MEMS device includes a flexible element made up of one or more noble metals and one or more alloying elements, wherein the one or more alloying elements form a solid solution with the noble metal, wherein each of the one or more alloying elements has a solid solubility of at least 1 wt. % in the noble metal and wherein the one or more alloying elements are present in an amount sufficient to provide at least one performance characteristic that is at least 50% greater than the base metal alone. In at least some embodiments, the performance characteristic is selected from the group consisting of yield strength, tensile strength and hardness.

In one aspect of the invention, a micromechanical device includes at least one flexible member formed from an alloy, where the alloy includes one or more noble metals, and one or more alloying elements. Each of the alloying elements has an equilibrium solid solubility of at least 1 wt. % in the noble metal, and the one or more alloying elements are present in an amount that does not result in precipitates.

In another aspect of the invention, a MEMS device includes a flexible element formed from an alloy made up of a base metal selected from the group consisting of platinum, gold and palladium and one or more of alloying elements selected from a group consisting of iridium, ruthenium, rhodium, palladium, gold, tungsten, osmium and nickel, wherein the one or more alloying elements form a solid solution with the one or more noble metals and wherein the one or more alloying elements are present in an amount sufficient to provide at least one performance characteristic at least 50% greater than the noble metal alone, said performance characteristic selected from the group consisting of yield strength, tensile strength and hardness. In at least some embodiments, the alloy forms a solid solution without precipitates.

In another aspect of the invention, a micromechanical device including a mirror is provided. The device includes a flexible member formed from an alloy comprising one or more noble metals selected from the group consisting of gold, platinum and palladium; and one or more alloying elements, the elements selected from iridium, ruthenium, rhodium, palladium, gold, tungsten, osmium and nickel. The one or more alloying elements form a solid solution with the one or more noble metals and are present in an amount sufficient to provide at least one performance characteristic at least 50% greater than the noble metal alone. The device includes at least one supporting member for positioning the flexible member apart from a substrate; and a mirror positioned on the flexible member and capable a movement when the flexible member is moved. In at least some embodiments, the surface of the alloy serves as the mirror.

In another aspect of the invention, a process for fabricating a micromechanical device is provided, which includes depositing an alloy on a substrate to form at least one flexible member and removing a portion of the substrate beneath the deposited alloy layer to obtain a flexible member. The alloy includes one or more noble metals selected from the group consisting of platinum, gold and palladium; and one or more alloying elements, the elements selected from the group consisting of ruthenium, rhodium, iridium, palladium, gold, tungsten, osmium, and nickel, wherein the one or more alloying elements forms a solid solution with the one or more noble metals.

As used herein, a "flexible element" or a "flexible member" refers to that component of a MEMS device which bends, flexes, twists or otherwise is deformed during operation of the MEMS device. The flexible element may form, without limitation, a switch, spring, beam, member, membrane or flexure, and may function as an actuator, sensor, valve, positioner or switch.

"Toughness" describes the ability of a metal to rapidly distribute within itself both the stress and strain caused by a suddenly applied load. It is to be compared with "brittleness" which carries the implication of sudden failure. A brittle material has little resistance to failure once the elastic limit has been reached. Many of the alloys of the invention exhibit high toughness.

"Yield strength" is defined as the stress required to produce a specified amount of plastic strain. It is typically measured in units of force (Mpa or ksi). Stresses greater than the yield strength result in plastic deformation of the element.

"Tensile strength" is defined as the maximum tensile stress achieved in a plot of stress vs. strain, measured as follows. Tensile strength is determined by applying a tensile stress to material failure and dividing by the original cross-sectional area of the test piece.

In general, as the hardness increases both tensile and yield strengths increase while elongation (ductility) decreases.

As used herein, the term "about" when used to refer to wt. % in an alloy composition means±10% of the reported wt. %. As used herein, the term "about" when used to refer to measured characteristics of the alloy composition means±20% of the reported value.

BRIEF DESCRIPTION OF THE DRAWING

Various objects, features, and advantages of the present invention can be more fully appreciated with reference to the following detailed description of the invention when considered in connection with the following drawings. The drawings are presented for illustration purposes only and are not limiting of the invention, in which.

DETAILED DESCRIPTION OF THE INVENTION

A MEMS device according to the present invention includes all categories of devices that can perform the functions associated with MEMS applications. Thus, by way of example only, the MEMS device of the present invention may be configured to function as switches, valves, positioners, actuators, sensors, and the like. In at least some embodiments, the noble metal alloys of the present invention may be used, without limitation, to form springs, flexures, beams, switches, acuators and other components of a MEMS device that undergo movement, e.g., twisting or bending, during operation. In at least some embodiments, the MEMS device may include a torsional or bending flexure element for actuation device applications including, but not limited to, mirror arrays and scanning mirrors. In at least some embodiments, the alloy may be used to form a moveable mechanical element in a MEMS device. An exemplary device includes, but is not limited to, a cantilever or spanning beam made from the alloy of the present invention that supports a movable piece. A thin film of the alloy may be used as a deformable membrane or a mirror. Membrane deformation causes the optical properties to change. For example the deformable membrane can be used as an optical attenuator, spatial light modulator or microwave switch. The device can include a plurality of flexible members or deformable membranes.

Figure 1:
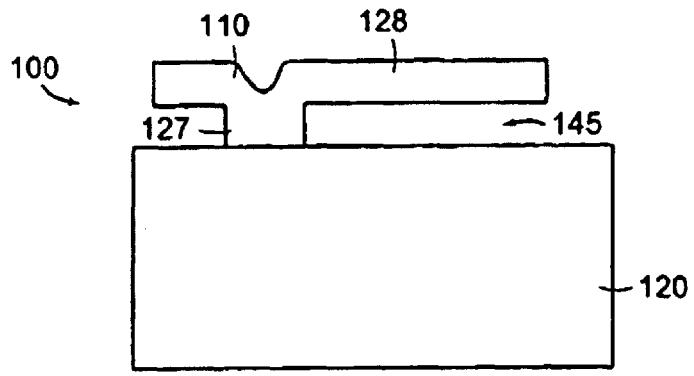
FIG. 1 is a cross-sectional view of the formation of a micromechanical device according to at least some embodiments of the invention.

An exemplary MEMS device 100 in which the flexible member is a cantilever beam is shown in FIG. 1. The device 100 includes a substrate 120 and a flexible member 110. The flexible member includes a base 127, which supports a cantilever beam 128 over the substrate. A gap 145 between the substrate and the beam 128 defines a range of motion for the flexible member.

In at least some embodiments, the flexible member is made from a metal alloy including a base metal and an alloying metal. The base metal may be one or more of the noble metals gold, platinum and palladium. Noble metals provide corrosion resistance and electrical conductivity. The alloying element may be one or more of the elements iridium, ruthenium, rhodium, palladium, gold, tungsten, osmium and nickel. The alloying element is selected for its high solubility in the base metal without the formation of precipitates. In at least some embodiments, the equilibrium and/or the metastable solid solubility of the alloying element in the base element is at least 1 wt. %. In at least some other embodiments, the alloying element is alloyed with the base metal at a level that does not produce precipitates. Solid solubility properties of the alloyed elements in the base metal may be readily determined from conventional sources, such as binary or ternary phase diagrams. See, *Binary Alloy Phase Diagrams*, $2^{nd}$ Ed., ASM International (1990). In some embodiments of the invention, the deposited and annealed thin film (from which the flexible element is formed) does not achieve the equilibrium phase state, and metastable alloys are formed with compositions beyond the equilibrium composition. These metastable alloys are nonetheless useful and can be used in the devices of the invention.

The alloying metal is present in an amount that improves at least one performance characteristic for the MEMS device by about at least 50% over the base metal alone. Exemplary performance criteria include tensile strength, yield strength, and hardness. By way of example, the tensile strength is at least about 1000 MPa, or in other examples, at least about 5000 MPa; the yield strength is at least about 750 MPa, or in other examples, at least about 1500 MPa; and the hardness is at least about 5 GPa, or in other examples, at least about 10 GPa.

In at least some embodiments, the alloying metal is present in an amount that is below its solubility limit in the base metal so as to avoid particle precipitation. Formation of extremely small and uniformly dispersed particles in a solid solution, also known as precipitate hardening, can result in the hardening and strengthening of a metal alloy. However, those particles provide point defects or fracture sites and can unacceptably increase the brittleness and decreases the fatigue life of the material. Thus, a solid solution of alloying elements in a palladium or platinum base is provided that improves the toughness of the flexible element and reduces plastic deformation, while avoiding precipitate formation that increases brittleness and decreases fatigue life.

The alloying element is also present in an amount that does not overly reduce the electrical conductivity of the alloy when compared to the base metal alone. In at least some embodiments, the electrical conductivity of the alloy is reduced to no less than 10% of the conductivity of the base metal alone.

In at least some embodiments, the base metal includes platinum and the alloying element includes iridium (Ir). The alloy may have a composition of about 65 to 99.9 wt % Pt and about 0.1 to 35 wt % Ir.

In at least some embodiments, the base metal includes platinum and the alloying element includes ruthenium (Ru). The alloy may have a composition of about 80 to 99.9 wt % Pt and about 0.1 to 20 wt % Ru.

In at least some embodiments, the base metal includes platinum and the alloying element includes rhodium (Rh). The alloy may have a composition of about 60 to 99.9 wt % Pt and about 0.1 to 40 wt % Rh.

In at least some embodiments, the base metal includes platinum and the alloying element includes nickel (Ni). The alloy may have a composition of about 80 to 98 wt % Pt and about 2 to 20 wt % Ni.

In at least some embodiments, the alloy is an alloy of platinum with palladium (Pd). The alloy may have a composition of about 1 to 99.9 wt % Pt and about 1 to 99 wt % palladium (Pd).

In at least some embodiments, the alloy includes about 70 wt. % Au and about 30 wt. % Pt. In at least some other embodiments, the alloy includes about 66 wt. % Au, about 17 wt. % Ni and about 17 wt. % Cr.

In at least some embodiments, flexible MEMS elements of the present invention are made from gold, platinum or palladium alloys with rhodium, ruthenium, iridium, palladium and/or nickel. In at least some embodiments, the alloy contains two or more alloying elements. In at least some embodiments, the base metal includes platinum and the alloying elements may be rhodium (Rh) and ruthenium (Ru). In some embodiments, an alloy is made up of 78.9 to 80.1 wt. % Pt, 14.9 to 15.1 wt. % Rh, and 5.0 to 6.1 wt. % Ru.

This alloy is available from Sigmund Cohn Corp. under the tradename Alloy 851, which is a platinum alloy containing 15% rhodium and 5% ruthenium. This alloy possesses high hardness and tensile strength without significant compromise to electrical conductivity.

Materials properties of exemplary platinum alloys are presented in Table 1, as reported in ASM Handbook of Metals, Vol. 2 1990. Properties are reported for alloys that were annealed at 700° C. MEMS devices can be fabricated from these alloys with a lower temperature or no anneal, in which case the properties may vary.

TABLE 1

Material properties of platinum alloys.

| Alloy composition | Tensile strength (MPa) | Electrical resistivity (μΩ-cm) | Alloy composition | Tensile strength (MPa) | Electrical resistivity (μΩ-cm) |
| --- | --- | --- | --- | --- | --- |
| Pt | 163 | 10.6 | Pt-5 wt % Rh | 205 | 17.5 |
| Alloy 851 | 2070 | 30.8 | Pt-10 wt % Rh | 310 | 19.2 |
| Pt-5 wt % Ir | 275 | 19.0 | Pt-20 wt % Rh | 485 | 20.8 |
| Pt-10 wt % Ir | 380 | 25.0 | Pt-30 wt % Rh | 540 | 19.4 |
| Pt-15 wt % Ir | 515 | 28.5 | Pt-40 wt % Rh | 565 | 17.5 |
| Pt-20 wt % Ir | 690 | 31.0 | Pt-5 wt % Ni | 640 | 23.6 |
| Pt-25 wt % Ir | 860 | 33.0 | Pt-10 wt % Ni | 815 | 29.8 |
| Pt-30 wt % Ir | 1105 | 35.0 | Pt-20 wt % Ni | 910 | 35.0 |
| Pt-5 wt % Ru | 415 | ~30 | Pt-20 wt % Pd | ~330–360 | ~25–28 |
| Pt-10 wt % Ru | 570 | ~47 | Pt-40 wt % Pd | ~370–390 | ~30 |
| Pt-3.5% wt Rh | 170 | 16.6 | Pt-60 wt % Pd | ~330–360 | ~27–29 |

The alloys of the present invention provide improved properties for flexible members incorporated into MEMS devices. The above table establishes that alloys of platinum exhibit increased tensile strength over platinum alone, without significant loss of electrical conductivity (reported in the table above as resistivity). Loss of electrical conductivity is considered significant when the alloy exhibits an electrical conductivity that is less than 10% of the electrical conductivity of the noble metal alone. In at least some embodiments, the tensile strength of the flexible member is at least 50% greater than that for the base metal. In at least some embodiments, the yield strength of the flexible member is improved over that of the base metal and is at least 50% greater than that for the base metal. In at least some embodiments, the hardness of the flexible member is improved and is at least 50% greater than that for the base metal. In at least some embodiments, the performance characteristics of tensile strength, yield strength and hardness can be many fold greater than those of the base metal. This is exemplified for platinum in Table 1, where greater than a 6-fold increase in tensile strength is reported for an Ir alloy.

When a material is subjected to an external load it becomes distorted or strained. With metals, provided the loading is not too great, they return to their original dimensions when the load is removed, i.e. they are elastic. Within the limits of elasticity, the ratio of the linear stress to the linear strain is termed the modulus of elasticity or more commonly known as Young's Modulus.

Similarly, yield strength defines the stress required to produce a specified amount of plastic strain. Stresses greater than the yield strength result in plastic deformation of the element. Yield strength quantifies the ability of the material to withstand an applied stress without plastic deformation. This feature is attractive in the flexible element since it allows the element to return to its original shape (e.g., position) after the stress is removed.

Tensile strength defines the maximum apparent tensile stress found in a plot of stress vs. strain. Tensile strength is determined by applying a tensile stress to material failure and dividing by the original cross-sectional area of the test piece. The test provides information on yield point, tensile strength and elongation and is important to MEMS devices since many of the movements involve tensile strain. In general, as the hardness increases, both tensile and yield strengths increase while elongation (ductility) decreases.

The flexible members are prepared from alloys using alloying elements that form solid solutions with the base metal and which, when alloyed, improve the strength characteristics of the alloy. The resulting flexible elements exhibit increased yield strength, and tensile strength; however, they retain much of their desirable properties as metal, namely, electrical conductivity and fracture resistance. Furthermore, noble metals gold, platinum and palladium are inert to most environments, and provide stable, non-reactive, non-corroding base materials for use in forming flexible MEMS elements. The properties of the noble metal alloys used in at least some embodiments of the present invention are qualitatively compared to conventional materials used in forming MEMS devices in Table 2. Yield strength, Young's Modulus and resistivity are reported in Table 3 for Alloy 851 and conventional materials.

TABLE 2

Comparison of properties of various materials for use as flexible MEMS members

| Material | Alloy 851 | Silicon | Be—Cu | Gold |
|---|---|---|---|---|
| Fracture toughness | Excellent | Poor | Excellent | Excellent |
| Toxicity | Low | Low | Very high | Low |
| Corrosion resistance | Excellent | Excellent | Poor | Excellent |
| Yield strength | Excellent | Excellent | Good | Very poor |
| Electrical conductivity | Good | Poor | Excellent | Excellent |
| Plasticity | Low | Low | Moderate | High |

TABLE 3

Measured properties of various materials used as flexible MEMS members*

| Material | Alloy 851 | Silicon | Be—Cu | Gold |
|---|---|---|---|---|
| Yield Strength (GPa) | 1.5 | 5.1 | 0.697 | <0.01 |
| Young's Modulus (GPa) | 205 | 170 | 128 | 77.2 |
| Resistivity (micro-ohm-cm) | 31 | 150 | 9.6 | 2.2 |

*Data from www.Matweb.com

An exemplary process for manufacturing elastically deformable microelectromechanical structures (MEMS) is provided. However, the structures and architectures of MEMS devices vary greatly, and numerous fabrication techniques are available to practitioners in the art. It is recognized that any method suitable for obtaining the desired structures may be used. See, e.g., M. J. Madou, *Fundamentals of Microfabrication*, (1997) ISBN 0-8493-9451-1.

Figure 2:
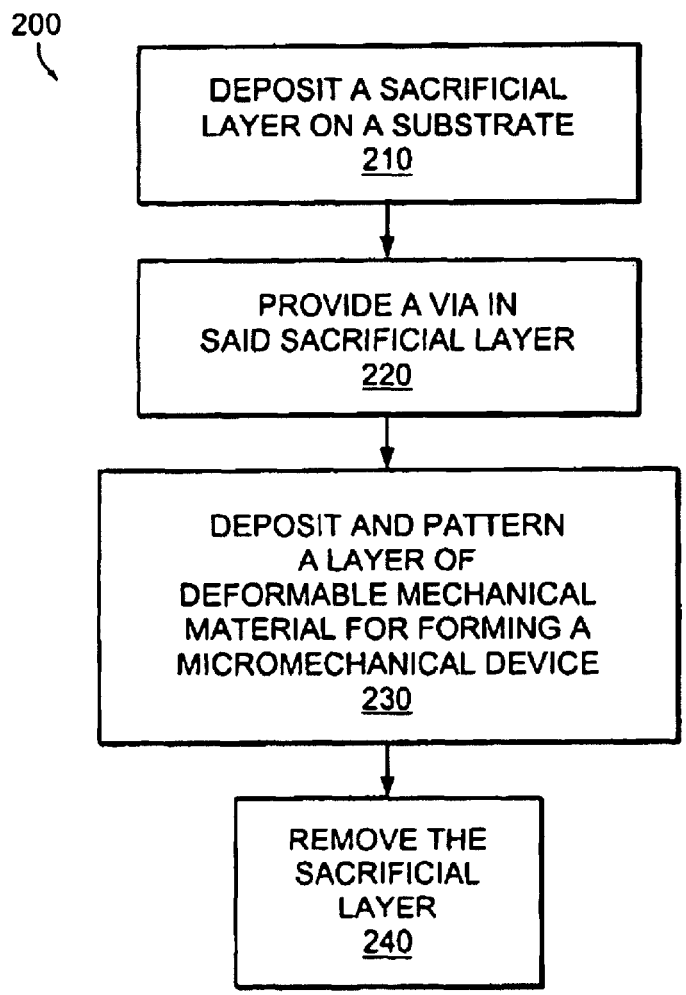
FIG. 2 is a flow chart of the process for fabrication of a MEMS device according to at least some embodiments of the invention.
Figure 3A:
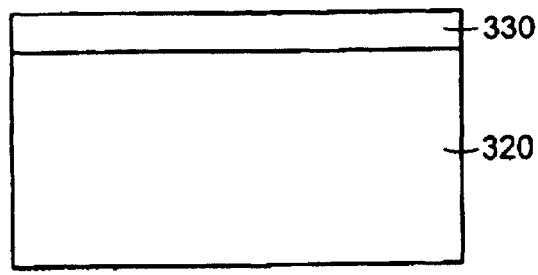
FIGS. 3A–3D illustrate the formation of a micromechanical device according to at least some embodiments of the invention.
Figure 3B:
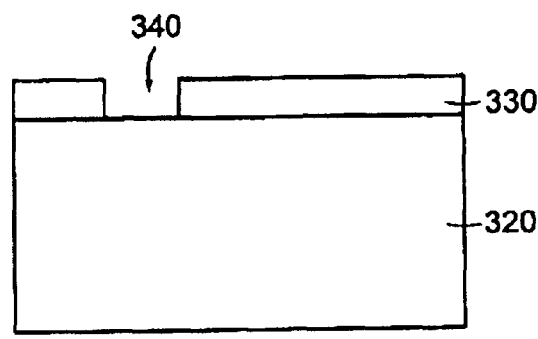
Figure 3C:
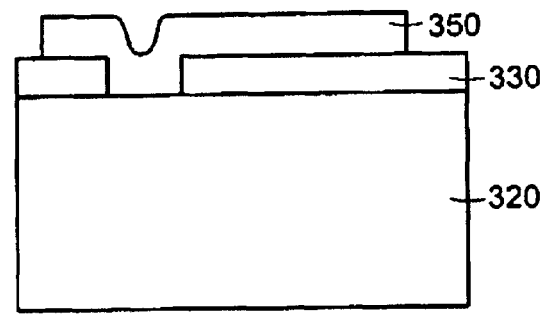
Figure 3D:
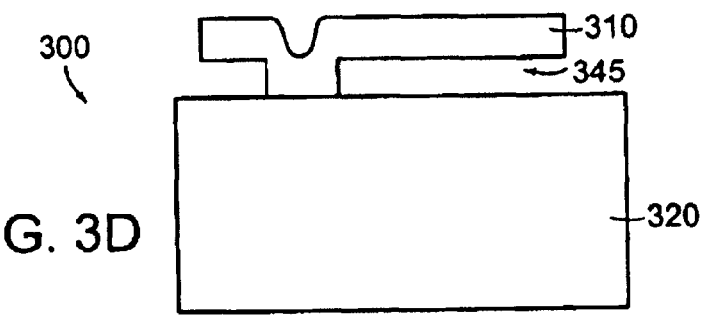

Referring now to FIG. 2, a process flow diagram 200 for producing a elastically deformable micromechanical structure is shown. The steps of the process are shown in FIG. 3. A flexible element 310 of a micromechanical structure 300 is made from a noble metal alloy according to at least some embodiments of the present invention.

At step 210, a sacrificial layer 330 is deposited and patterned on the substrate 320. This sacrificial layer can be an organic material such as photoresist, other material such as polysilicon, or a metal such as aluminum, chrome, copper or nickel. Typical thickness of this sacrificial layer is in the range of approximately 0.01 to 10 micrometers, and preferably approximately 1 micrometer, depending upon the specific application.

At step 220, a via 340 is produced in the sacrificial layer. The via may be produced by using photolithography and developer, or a commercial wet etchant, or by other techniques such as plasma etching, sputter etching, and reactive ion etching.

At step 230, an alloy layer 350 is deposited and patterned on the substrate. An adhesion layer can be deposited on the substrate before deposition of the alloy layer to improve adhesion properties. The adhesion layer is in the range of about 5–2000 Angstroms and can be made up of one or more of titanium, chromium, TiW, zirconium or tantalum. The alloy layer is made from the noble metal alloy of the invention. The layer may be deposited by sputtering, electroless plating, electroplating or other techniques which may be patterned by liftoff or chemical etching or depositing through a photoresist mold. In at least some embodiments, the alloy layer may be prepared by co-deposition or co-sputtering of the alloy elements from individual targets, or from targets containing a mixture of the alloy elements. Exemplary sputtering techniques include rf-sputtering and dc-magnetron sputtering. An advantage of the materials and methods of at least some embodiments of the invention is that the alloys may be sputter-deposited at temperatures at or near room temperature. Thus, the formation of the flexible element may be readily incorporated into standard microfabrication processes.

At step 240, the sacrificial layer is removed, releasing the flexible element 310, e.g., as shown here, a cantilever arm. The removal of the sacrificial layer may be performed by etching or dissolving chemically to yield the final structure. Preferably the etchant is chosen to dissolve the sacrificial layer and not the elastically deformable structure. Upon removal of the sacrificial layer, a gap 345 exists between the substrate and the flexible element 310.

In at least some embodiments of the present invention, a flexible element may be prepared on a substrate using a liftoff process, which allows definition of a pattern on the substrate surface without chemical etching. An example of a suitable liftoff process includes using a liftoff layer, followed by photoresist. Metal is lifted off in selected areas by dissolving the underlying liftoff layers. The liftoff layer is deposited by a technique such as spin coating. The photoresist is then also deposited by spin coating and then exposed and developed as is conventional in the semiconductor fabrication field. During the development step, the liftoff layer is etched at a faster rate than the resist. Thus, by changing the development time of the resist, the amount of resist overhang can be varied. The metal of interest may then be sputtered onto the substrate and is discontinuous at the areas of resist overhang. The resist overhang helps the liftoff process by breaking the subsequently deposited metal film during the removal of the resist. As the metal films of the present invention are resistant to many etching solutions, the surface of the wafers may be cleaned after a liftoff process without damage to the metal layer.

Figure 4:
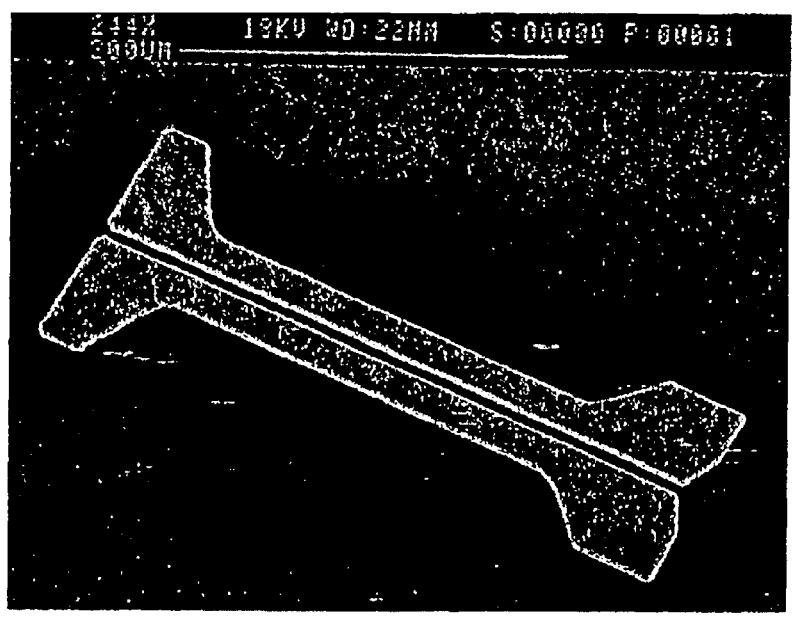
FIG. 4 is a photomicrograph of a pair of sputtered Pt—Ru—Rh alloy MEMS springs formed on a silicon wafer substrate.

A Pt-15 wt. %-Rh-6 wt. % Ru alloy was sputter-deposited on a silicon wafer to a thickness of 2 µm using a de magnetron sputter system. A lift-off photolithography procedure (well known to practitioners of the art of micromachining) was used to pattern the alloy film to form flexures. The intermediate portions of the flexures between anchors were freed up by etching away the substrate using a reactive ion etch followed by a $XeF_2$ isotropic etch. These flexures were 14 microns wide, 380 microns long, 2 microns thick, and had wide anchor regions at the end for adhesion to the substrate. A micromachined mirror was fabricated using this Pt alloy flexure as springs. A photograph of the flexures and part of a finished mirror are shown in FIG. 4. The rotation of this mirror was without any measurable hysteresis (<0.01 degree rotation).

Figure 5:
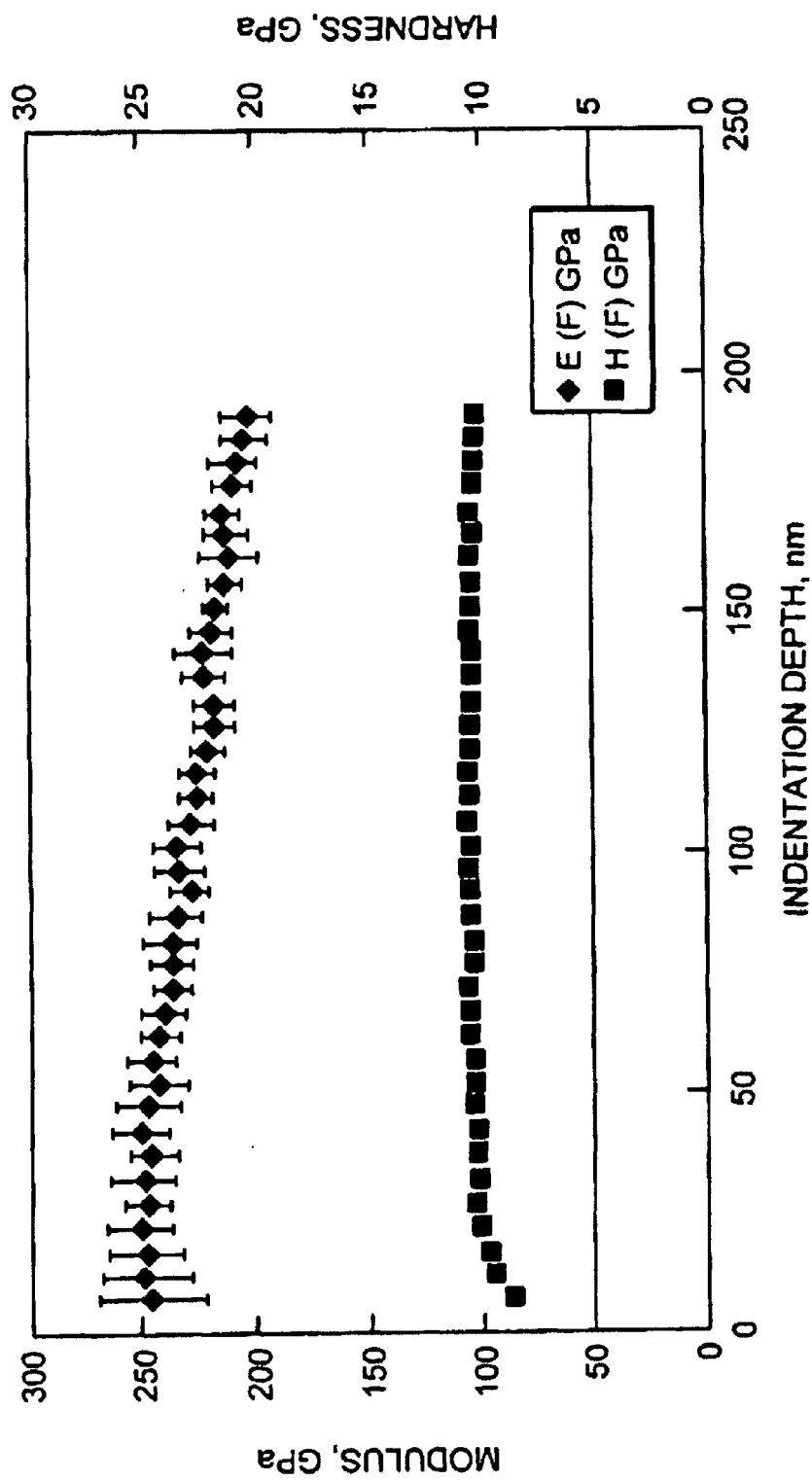
FIG. 5 is a plot of the hardness and Young's Modulus of a platinum-rhodium-ruthenium alloy used in at least some embodiments of the invention.

A similarly prepared alloy layer (which was not incorporated into a tilt mirror) was tested by a nano-indentation test and hardness, modulus of elasticity (E) and yield strength were determined. A plot of modulus (GPa) or hardness (GPa) vs. indentation depth (nm) is found in FIG. 5. Film hardness was 10.5 GPa; the Young's Modulus was 250 GPa; and the yield strength was calculated to be 3.5 GPa (calculated as one-third of the measured hardness). These results confirm the improved properties of the noble metal alloy and its usefulness for MEMS devices.

Although various embodiments that incorporate the teachings of the present invention have been shown and described in detail herein, those skilled in the art can readily devise many other varied embodiments that incorporate these teachings.

What is claimed is:

1. A microelectromechanical device, comprising:
at least one freestanding flexible member that bends, flexes, twists, or is deformed during operation of the microelectromechanical device and is formed from an alloy consisting essentially of about 40 to 80 wt% platinum and about 20 to 60 wt% palladium, said member exhibiting at least one performance characteristic at least 50% greater than either noble metal alone, said performance characteristic selected from the group consisting of yield strength, tensile strength and hardness.

2. A microelectromechanical device, comprising:
at least one freestanding flexible member that bends, flexes, twists, or is deformed during operation of the microelectromechanical device and is formed from an alloy comprising about 70 wt.% Au and about 30 wt.% Pt, said member exhibiting at least one performance characteristic at least 50% greater than either noble metal alone, said performance characteristic selected from the group consisting of yield strength, tensile strength and hardness.

3. A microelectromechanical device, comprising:
at least one freestanding flexible member formed form an alloy comprises about 66 wt. % Au, about 17 wt. % Ni and about 17 wt. % Cr.

4. A microelectromechanical device including a mirror, comprising:
a freestanding flexible member formed from an alloy comprising one or more noble metals selected from the group consisting of gold, platinum and palladium; and one or more alloying elements, the elements selected from iridium, ruthenium, rhodium, palladium, gold, tungsten, osmium and nickel, wherein the one or more alloying elements form a solid solution with the one or more noble metals having an equilibrium solid solubility of at least 1 wt.% in the noble metal and wherein the one or more alloying elements are present in an amount sufficient to provide at least one performance characteristic at least 50% greater than the noble metal alone;
at least one supporting member for positioning the flexible member apart from a substrate; and
a mirror positioned on the flexible member and capable a movement when the flexible member is moved.

5. A micromechanical device, comprising:
at least one freestanding flexible member that bends, flexes, twists, or is deformed during operation of the micromechanical device and is formed from an alloy, where the alloy comprises platinum and alloying elements rhodium and ruthenium, wherein each of the alloying elements have an equilibrium solid solubility of at least 1 wt.% in the platinum, and wherein the alloying elements are present in an amount sufficient to provide at least one performance characteristic at least 50 greater than the platinum alone, said performance characteristic slected form the group consisting of yield strength, tensile strength and hardness.

6. The device of claim 5, wherein the alloy comprises 78.9 to 80.1 wt % Pt, 14.9 to 15.1 wt % Rh, and 5.0 to 6.1 wt % Ru.

7. The device of claim 5, wherein the alloy is selected to provide a tensile strength of at least about 1000 MPa.

8. The device of claim 5, wherein the alloy is selected to provide a yield strength of at least about 750 MPa.

9. The device of claim 5, wherein the alloy is selected to provide a hardness of about 5 GPa.

10. The device of claim 5, wherein the alloy is selected to exhibit an electrical conductivity that is at least 10% of the electrical conductivity of the platinum alone.

11. The device of claim 5, wherein the freestanding flexible member comprises an actuator.

12. The device of claim 5, wherein the freestanding flexible member comprises an optical switching device.

13. A micromechanical device, comprising:
at least one freestanding flexible member formed from an alloy, where the alloy comprises platinum and alloying element iridium, wherein the alloying element has an equilibrium solid solubility of at least 1 wt.% in the platinum, and wherein the alloying element is present in an amount that does not result in precipitates.

14. The device of claim 13, wherein the alloying element is present in an amount sufficient to provide at least one performance characteristic at least 50% greater than the platinum alone, said performance characteristic selected from the group consisting of yield strength, tensile strength and hardness.

15. The device of claim 13, wherein the alloy comprises about 65 to 99.9 wt % Pt and about 0.1 to 35 wt % Ir.

16. The device of claim 14, wherein the alloy is selected to provide a tensile strength of at least about 1000 MPa.

17. The device of claim 14, wherein the alloy is selected to provide a yield strength of at least about 750 MPa.

18. The device of claim 14, wherein the alloy is selected to provide a hardness of about 5 GPa.

19. The device of claim 14, wherein the alloy is selected to exhibit an electrical conductivity that is at least 10% of the electrical conductivity of the platinum alone.

20. The device of claim 14, wherein the freestanding flexible member comprises an actuator.

21. The device of claim 14, wherein the freestanding flexible member comprises an optical switching device.

22. A micromechanical device, comprising:
at least one freestanding flexible member that bends, flexes, twists, or is deformed during operation of the micromechanical device and is formed from an alloy, where the alloy comprises platinum and alloying element ruthenium, wherein each of the alloying element have an equilibrium solid solubility of at least 1 wt.% in the platinum, and wherein the alloying element is present in an amount sufficient to provide at least one performance characteristic at least 50 greater than the platinum alone, said performance characteristic slected form the group consisting of yield strength, tensile strength and hardness.

23. The device of claim 22, wherein the alloy comprises about 80 to 99.9 wt.% Pt and about 0.1 to 20 wt.% Ru.

24. The device of claim 22, wherein the alloy is selected to provide a tensile strength of at least about 1000 MPa.

25. The device of claim 22, wherein the alloy is selected to provide a yield strength of at least about 750 MPa.

26. The device of claim 22, wherein the alloy is selected to provide a hardness of about 5 GPa.

27. The device of claim 22, wherein the alloy is selected to exhibit an electrical conductivity that is at least 10% of the electrical conductivity of the platinum alone.

28. The device of claim 22, wherein the freestanding flexible member comprises an actuator.

29. The device of claim 22, wherein the freestanding flexible member comprises an optical switching device.

30. A micromechanical device, comprising:
at least one freestanding flexible member that bends, flexes, twists, or is deformed during operation of the micromechanical device and is formed from an alloy, where the alloy comprises platinum and alloying element rhodium, wherein the alloying element has an equilibrium solid solubility of at least 1 wt.% in the platinum, and wherein the alloying element is present in an amount sufficient to provide at least one performance characteristic at least 50 greater than the platinum alone, said performance characteristic slected form the group consisting of yield strength, tensile strength and hardness.

31. The device of claim 30, wherein the alloy comprises about 80 to 99.9 wt.% Pt and about 0.1 to 40 wt.% Ru.

32. The device of claim 30, wherein the alloy is selected to provide a tensile strength of at least about 1000 MPa.

33. The device of claim 30, wherein the alloy is selected to provide a yield strength of at least about 750 MPa.

34. The device of claim 30, wherein the alloy is selected to provide a hardness of about 5 GPa.

35. The device of claim 30, wherein the alloy is selected to exhibit an electrical conductivity that is at least 10% of the electrical conductivity of the platinum alone.

36. The device of claim 30, wherein the freestanding flexible member comprises an actuator.

37. The device of claim 30, wherein the freestanding flexible member comprises an optical switching device.

38. A micromechanical device, comprising:
at least one freestanding flexible member that bends, flexes, twists, or is deformed during operation of the micromechanical device and is formed from an alloy, where the alloy comprises platinum and alloying element nickel, wherein the alloying element has an equilibrium solid solubility of at least 1 wt.% in the platinum, and wherein the alloying element is present in an amount sufficient to provide at least one performance characteristic at least 50 greater than the platinum alone, said performance characteristic slected form the group consisting of yield strength, tensile strength and hardness.

39. The device of claim 38, wherein the alloy comprises about 80 to 98 wt.% Pt and 2 to 20 wt.% Ni.

40. The device of claim 38, wherein the alloy is selected to provide a tensile strength of at least about 1000 MPa.

41. The device of claim 38, wherein the alloy is selected to provide a yield strength of at least about 750 MPa.

42. The device of claim 38, wherein the alloy is selected to provide a hardness of about 5 GPa.

43. The device of claim 38, wherein the alloy is selected to exhibit an electrical conductivity that is at least 10% of the electrical conductivity of the platinum alone.

44. The device of claim 38, wherein the freestanding flexible member comprises an actuator.

45. The device of claim 38, wherein the freestanding flexible member comprises an optical switching device.

46. The device of claim 13, wherein said at least one freestanding flexible member is capable of moving from a first position to a second position.

* * * * *

UNITED STATES PATENT AND TRADEMARK OFFICE
CERTIFICATE OF CORRECTION

| | | |
|---|---|---|
| PATENT NO. | : 7,244,367 B2 | Page 1 of 1 |
| APPLICATION NO. | : 10/015086 | |
| DATED | : July 17, 2007 | |
| INVENTOR(S) | : Bernstein et al. | |

It is certified that error appears in the above-identified patent and that said Letters Patent is hereby corrected as shown below:

Col. 11 line 45 "and about 0.1 to 40 wt.% Ru." should read -- and about 0.1 to 40 wt.% Rh. --

Signed and Sealed this

Nineteenth Day of July, 2011

David J. Kappos
*Director of the United States Patent and Trademark Office*